United States Patent
McShane et al.

(10) Patent No.: US 11,340,993 B2
(45) Date of Patent: May 24, 2022

(54) DEFERRED REBUILDING WITH ALTERNATE STORAGE LOCATIONS

(71) Applicant: International Business Machines Corporation, Armonk, NY (US)

(72) Inventors: Niall J. McShane, Arlington Heights, IL (US); Andrew D. Baptist, Mt. Pleasant, WI (US); Ravi V. Khadiwala, Bartlett, IL (US)

(73) Assignee: Pure Storage, Inc., Mountain View, CA (US)

( * ) Notice: Subject to any disclaimer, the term of this patent is extended or adjusted under 35 U.S.C. 154(b) by 469 days.

(21) Appl. No.: 16/427,420

(22) Filed: May 31, 2019

(65) Prior Publication Data

US 2019/0286525 A1 Sep. 19, 2019

Related U.S. Application Data

(63) Continuation-in-part of application No. 15/350,672, filed on Nov. 14, 2016, now Pat. No. 10,346,250, (Continued)

(51) Int. Cl.
*G06F 11/00* (2006.01)
*H03M 13/35* (2006.01)
(Continued)

(52) U.S. Cl.
CPC ........ *G06F 11/1435* (2013.01); *G06F 3/064* (2013.01); *G06F 3/067* (2013.01);
(Continued)

(58) Field of Classification Search
CPC .... G06F 11/1435; G06F 3/0619; G06F 3/064; G06F 3/067; G06F 11/1076; G06F 2211/1028; H03M 13/353; H04L 67/1097
See application file for complete search history.

(56) References Cited

U.S. PATENT DOCUMENTS 4,092,732 A  5/1978 Ouchi
5,454,101 A  9/1995 Mackay et al.
(Continued)

OTHER PUBLICATIONS

Chung; An Automatic Data Segmentation Method for 3D Measured Data Points; National Taiwan University; pp. 1-8; 1998.
(Continued)

*Primary Examiner* — Justin R Knapp
(74) *Attorney, Agent, or Firm* — Garlick & Markison; Timothy W. Markison; Timothy D. Taylor

(57) ABSTRACT

A method includes, when a first batch rebuild threshold is met, a computing device of a dispersed storage network (DSN) determining whether target storage units of a set of storage units of the DSN are available, where a data segment of data is dispersed storage error encoded into a set of encoded data slices, a number of encoded data slices that need rebuilding corresponds to the first batch rebuild threshold, and the number of encoded data slices is to be stored in the target storage units. When a target storage unit is unavailable, the method continues by delaying a batch rebuild process until the target storage unit is available or a second batch rebuild threshold is met. When the target storage unit becomes available before the second batch rebuild threshold is met, the method continues by executing the batch rebuild process for the number of encoded data slices.

14 Claims, 13 Drawing Sheets

Related U.S. Application Data which is a continuation of application No. 14/527,139, filed on Oct. 29, 2014, now Pat. No. 9,594,639.

(60) Provisional application No. 61/924,196, filed on Jan. 6, 2014.

(51) Int. Cl.

| | | |
|---|---|---|
| *H03M 13/00* | (2006.01) | |
| *G06F 3/06* | (2006.01) | |
| *G06F 3/00* | (2006.01) | |
| *G06F 11/10* | (2006.01) | |
| *G06F 11/14* | (2006.01) | |
| *H04L 67/1097* | (2022.01) | |

(52) U.S. Cl.
CPC ........ *G06F 3/0619* (2013.01); *G06F 11/1076* (2013.01); *H03M 13/353* (2013.01); *H04L 67/1097* (2013.01); *G06F 2211/1028* (2013.01)

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,035,914 | B1 | 4/2006 | Payne et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 9,229,824 | B2 * | 1/2016 | Resch ................ G06F 11/1088 |
| 9,594,639 | B2 | 3/2017 | Khadiwala et al. |
| 10,540,111 | B2 * | 1/2020 | Shah ................... G06F 3/0608 |
| 10,592,335 | B2 * | 3/2020 | Hegde ................... G11C 29/52 |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0028673 | A1 | 2/2003 | Lin et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula |
| 2005/0132070 | A1 | 6/2005 | Redlich et al. |
| 2005/0144382 | A1 | 6/2005 | Schmisseur |
| 2005/0229069 | A1 | 10/2005 | Hassner et al. |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2014/0298134 | A1 | 10/2014 | Grube et al. |
| 2014/0351674 | A1 | 11/2014 | Grube et al. |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

LEGG; Lightweight Directory Access Protocol (LDAP): Syntaxes and Matching Rules; IETF Network Working Group RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): String Representation of Search Filters; IETF Network Working Group; RFC 4515; Jun. 2006; pp. 1-12.

Smith; Lightweight Directory Access Protocol (LDAP): Uniform Resource Locator; IETF Network Working Group; RFC 4516; Jun. 2006; pp. 1-15.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

(56) References Cited

OTHER PUBLICATIONS

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): String Representation of Distinguished Names; IETF Network Working Group; RFC 4514; Jun. 2006; pp. 1-15.

\* cited by examiner

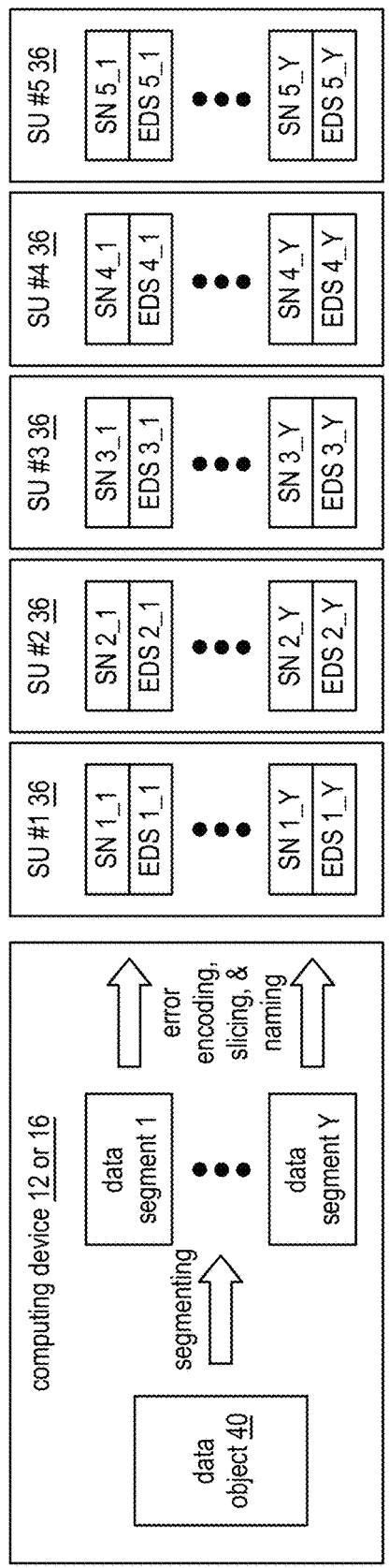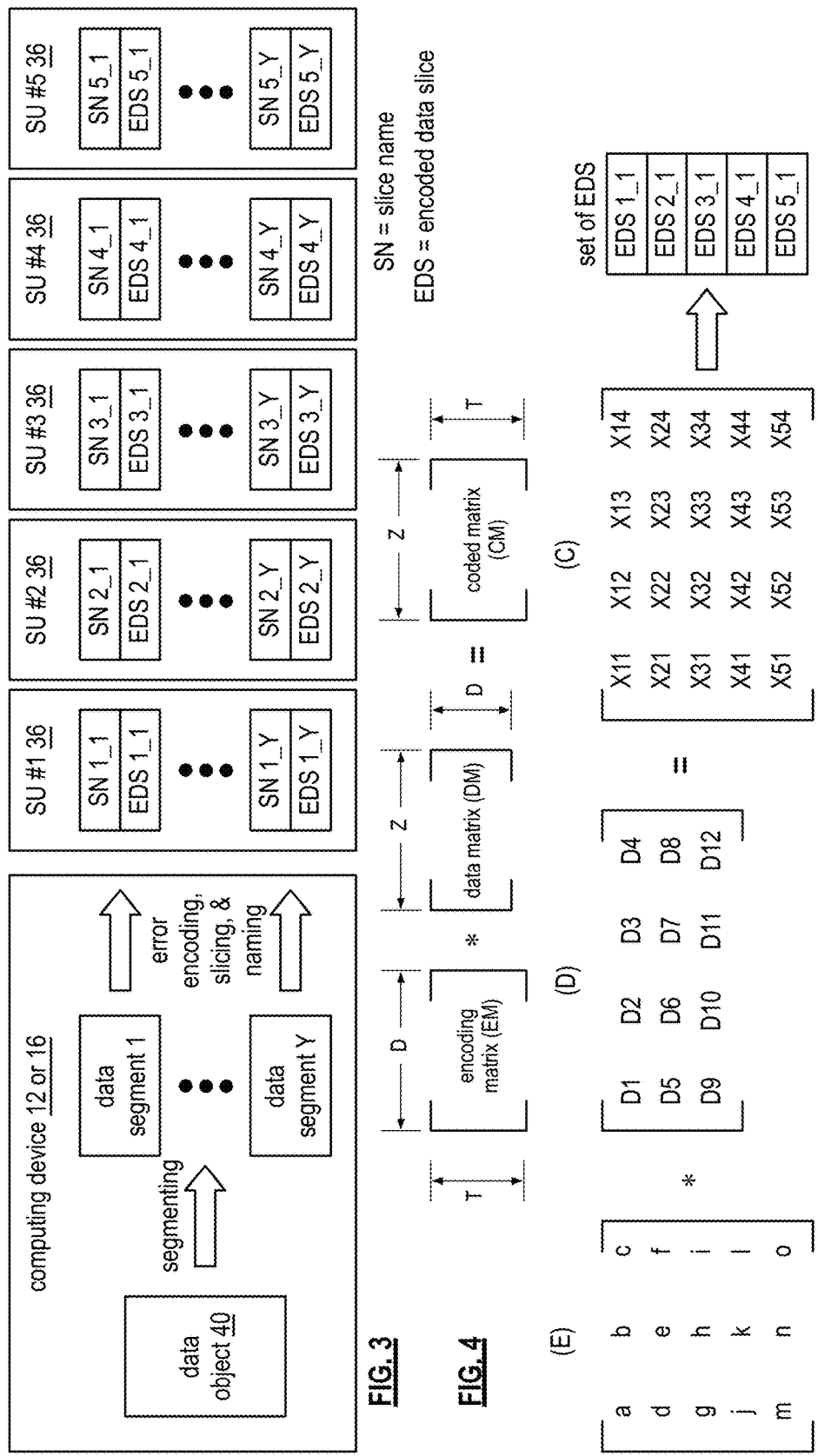

DEFERRED REBUILDING WITH ALTERNATE STORAGE LOCATIONS

CROSS REFERENCE TO RELATED PATENTS

The present U.S. Utility Patent Application claims priority pursuant to 35 U.S.C. § 120 as a continuation-in-part of U.S. Utility application Ser. No. 15/350,672, entitled "CONFIGURING STORAGE RESOURCES OF A DISPERSED STORAGE NETWORK", filed Nov. 14, 2016, which is a continuation of U.S. Utility application Ser. No. 14/527,139, entitled "CONFIGURING STORAGE RESOURCES OF A DISPERSED STORAGE NETWORK", filed Oct. 29, 2014, issued as U.S. Pat. No. 9,594,639 on Mar. 14, 2017, which claims priority pursuant to 35 U.S.C. § 119(e) to U.S. Provisional Application No. 61/924,196, entitled "CONFIGURING STORAGE SLOTS IN A DISPERSED STORAGE NETWORK", filed Jan. 6, 2014, all of which are hereby incorporated herein by reference in their entirety and made part of the present U.S. Utility Patent Applications for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to storage of dispersed storage encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

Figure 13A:
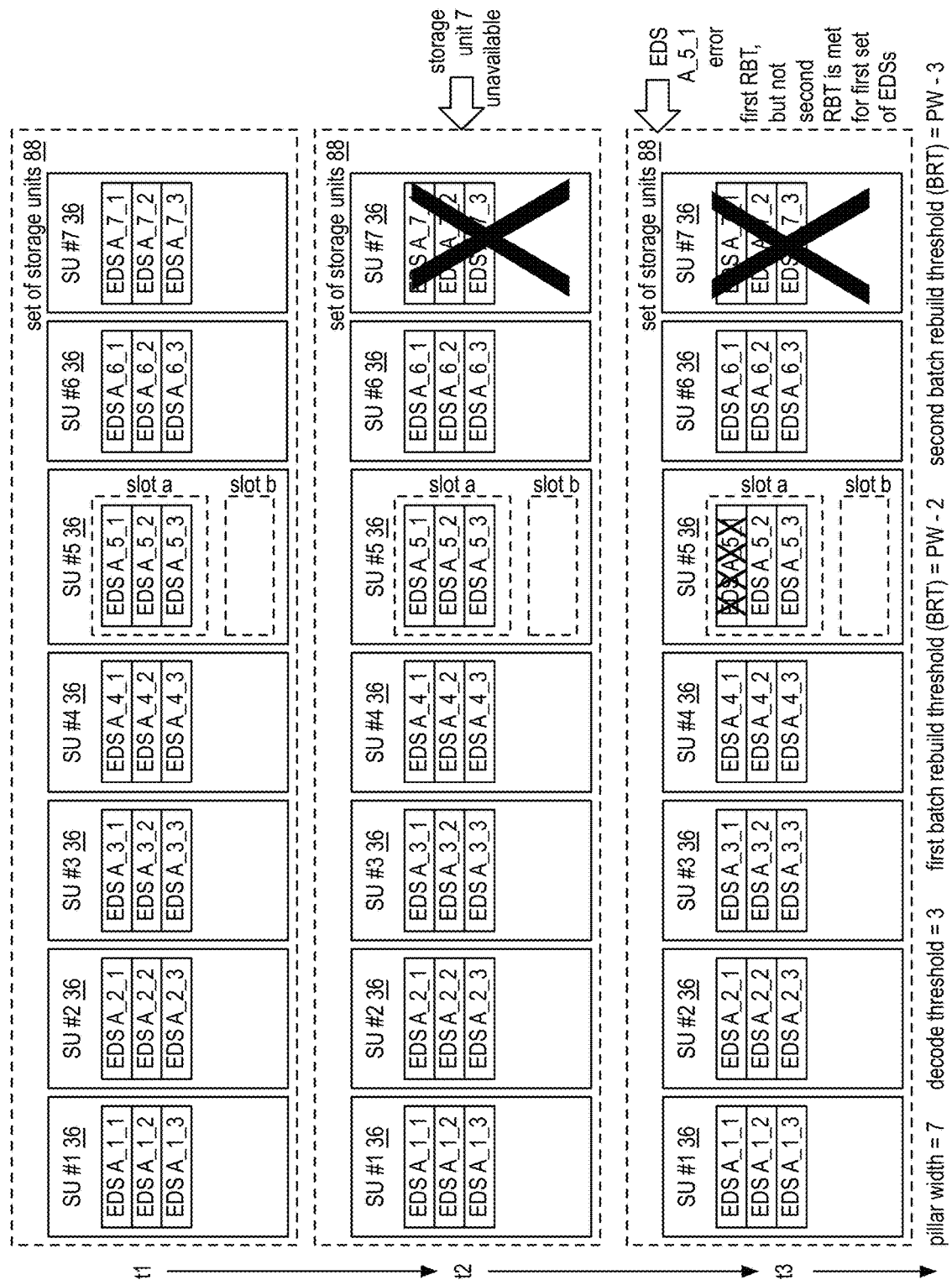
Figure 13B:
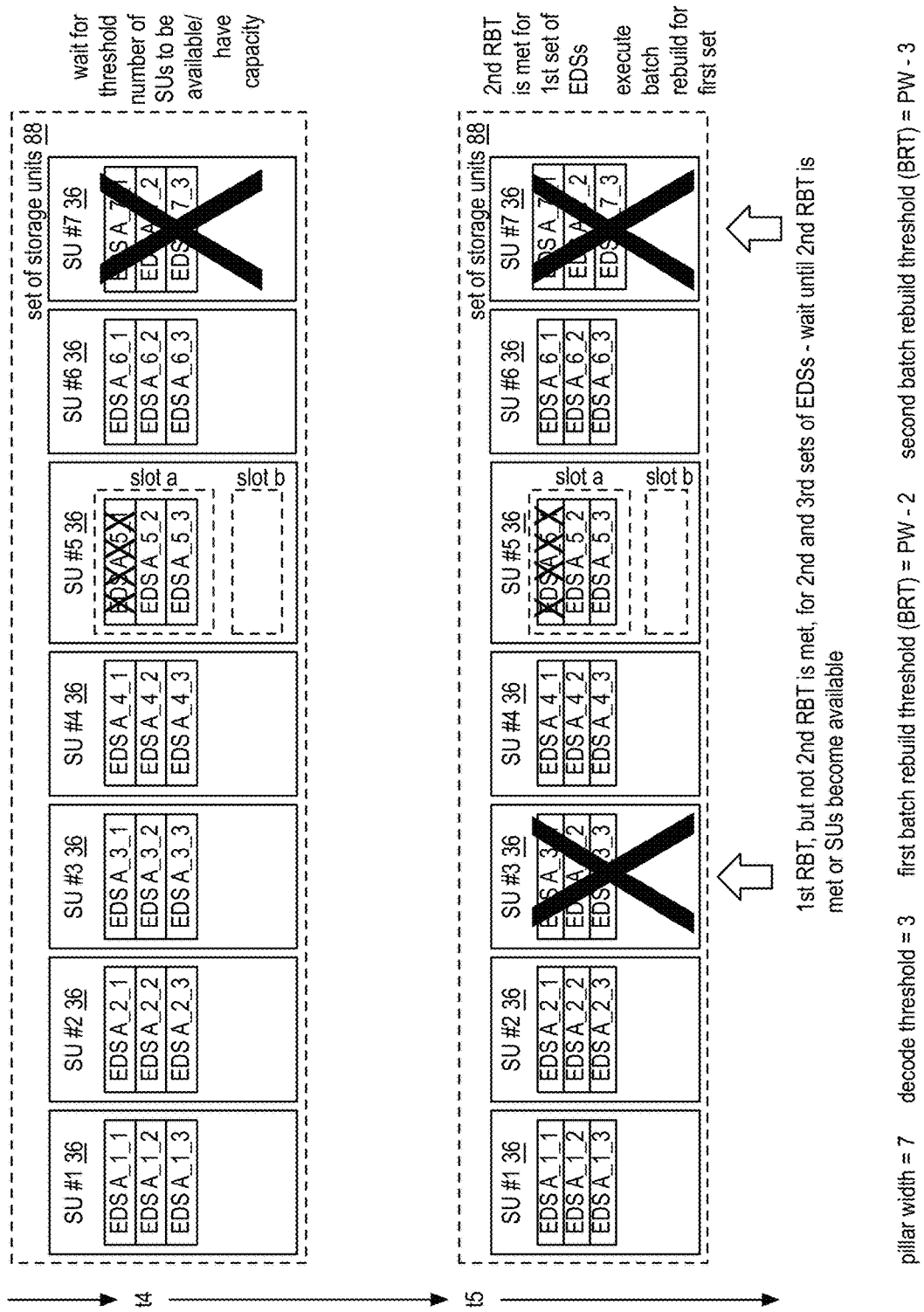
Figure 13C:
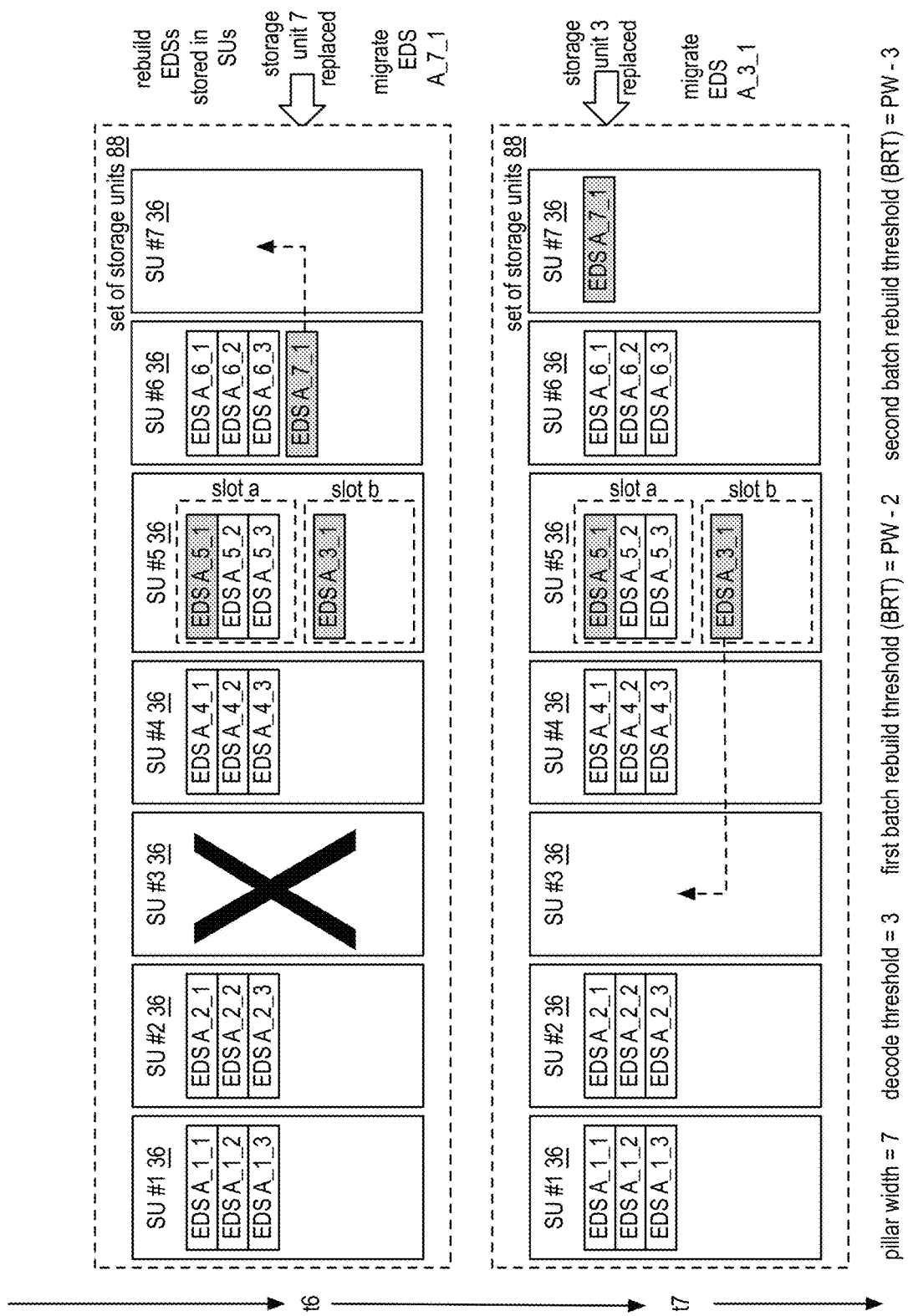
Figure 13D:
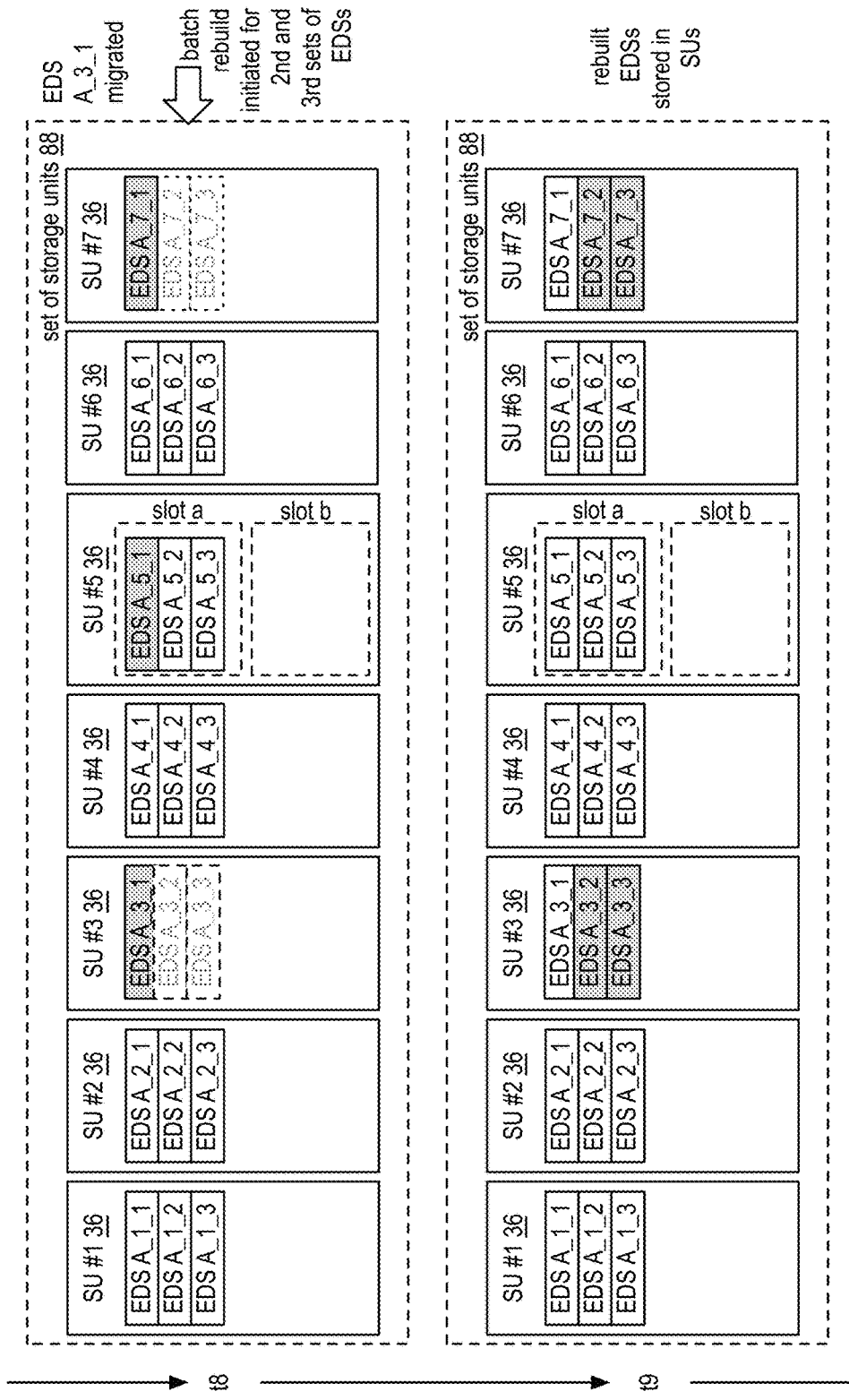
Figure 14:
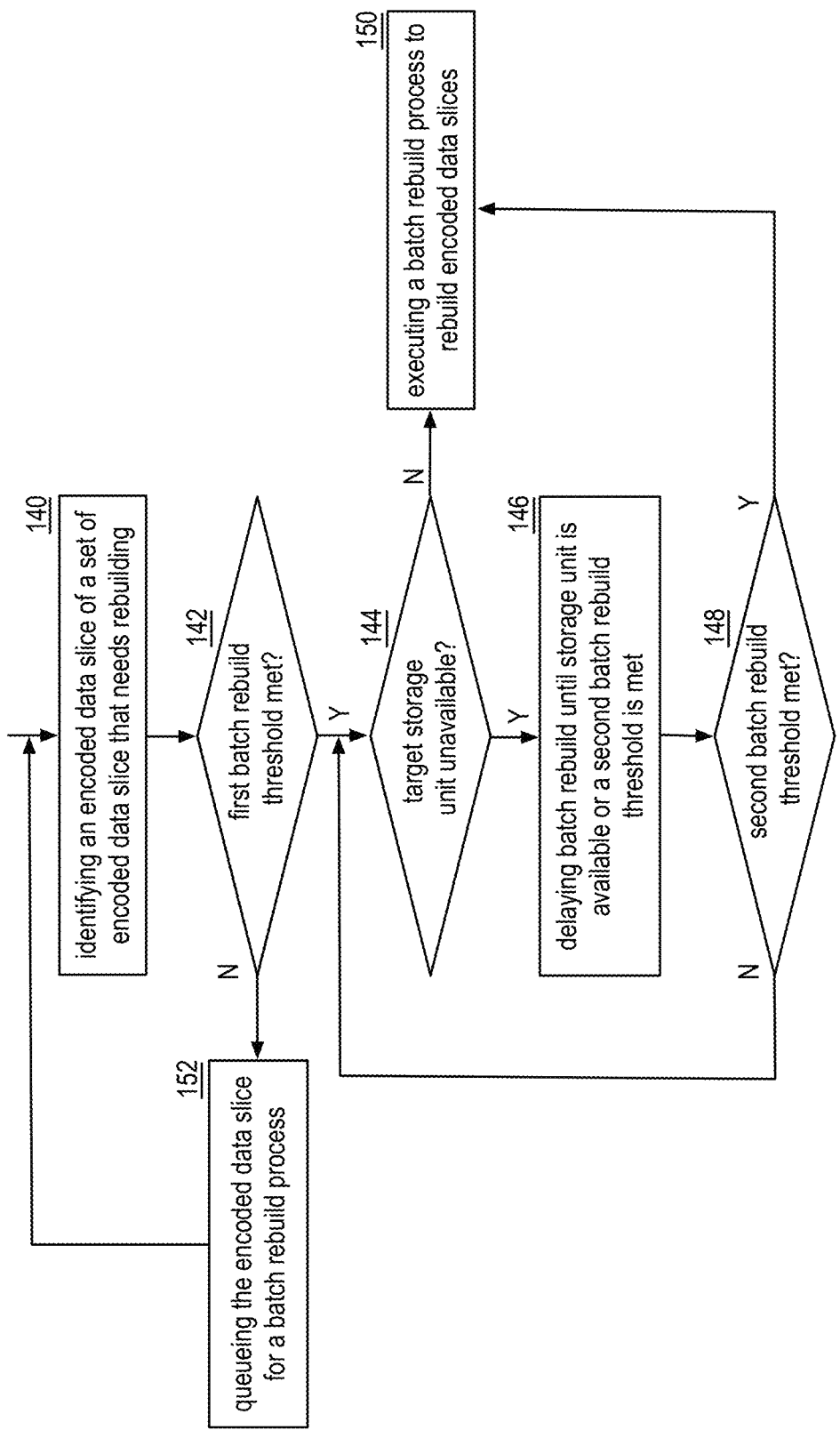

FIGS. 13A-D are a schematic block diagrams of another example of a batch rebuilding process in accordance with the present invention; and FIG. 14 is a flowchart illustrating an example of a method of a batch rebuilding process in accordance with the present invention.

DETAILED DESCRIPTION OF THE INVENTION

Figure 1:
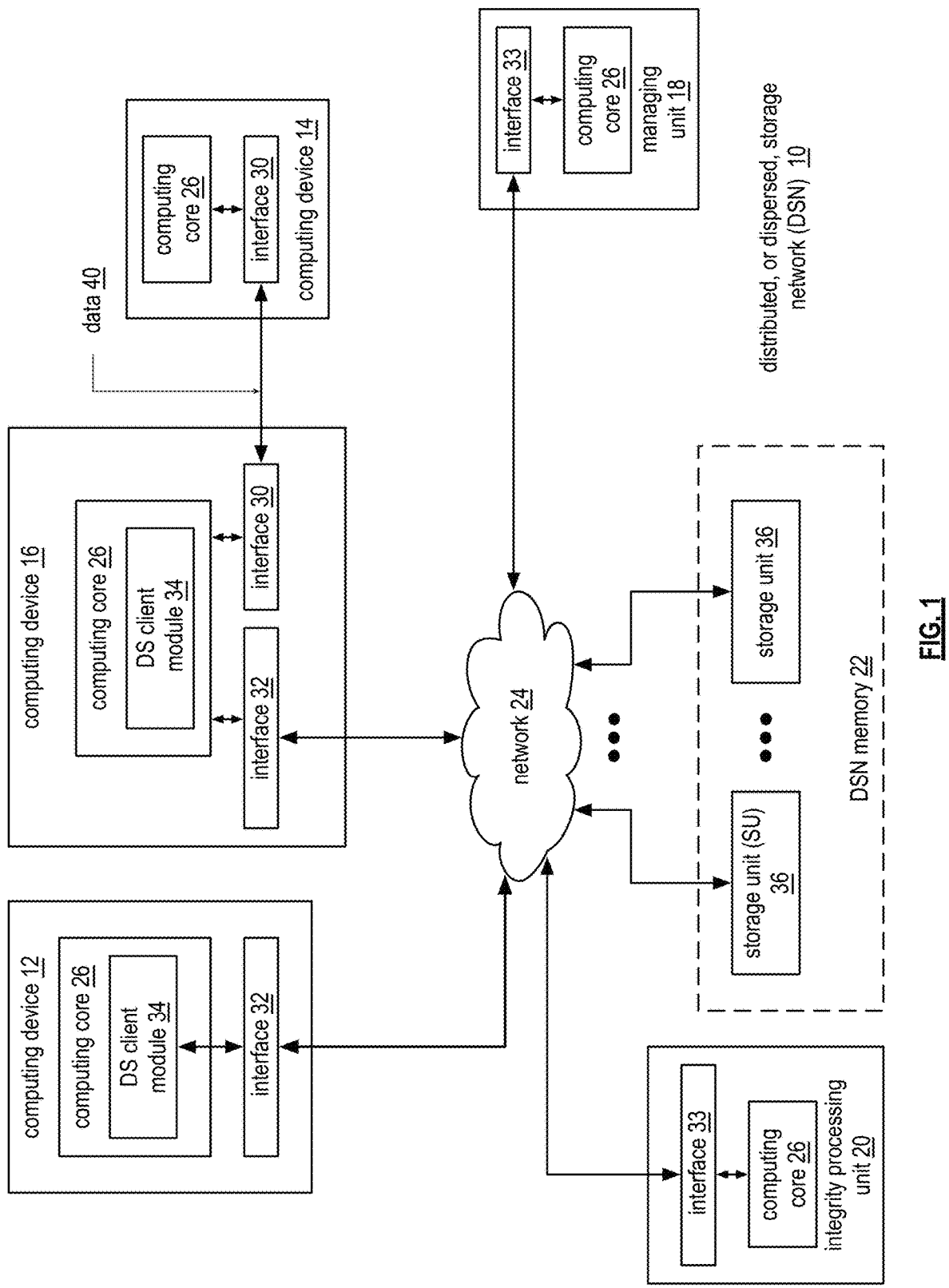
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
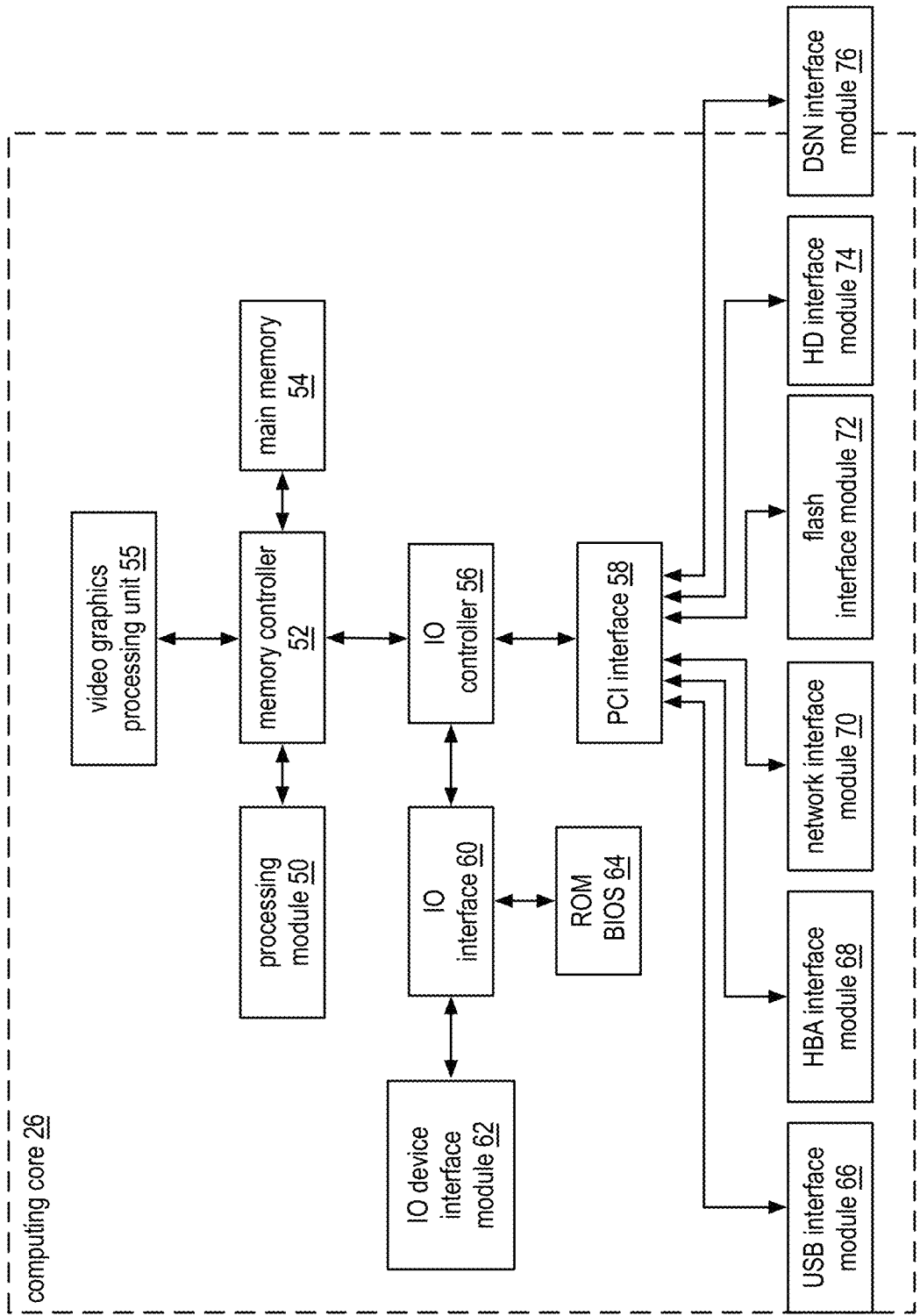
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data (e.g., data 40) on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DS managing unit 18 tracks the number of times a user accesses a non-public vault and/or public vaults, which can be used to generate a per-access billing information. In another instance, the DS managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figures 7, 8:
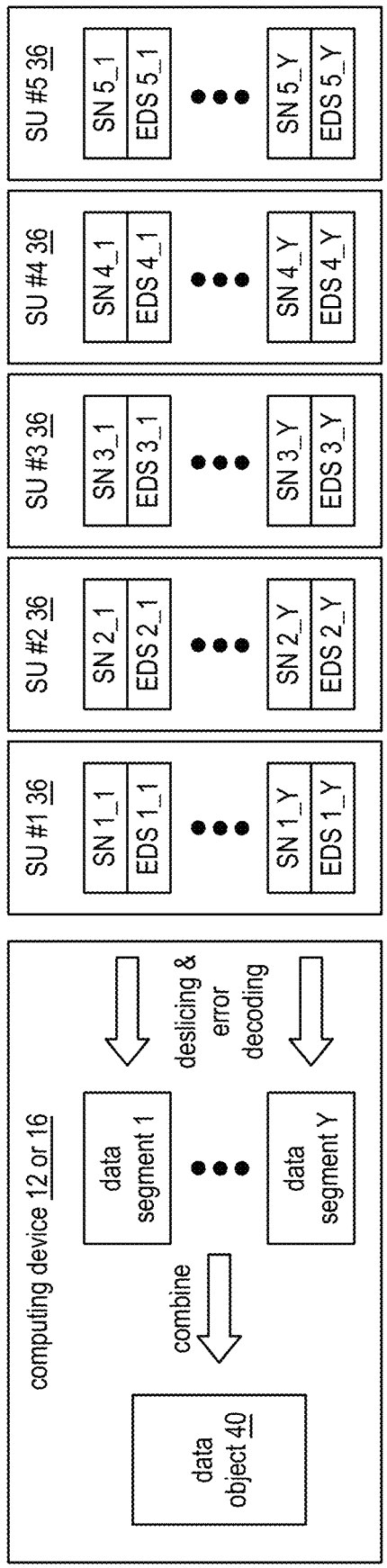
FIG. 7 is a schematic block diagram of an example of dispersed storage error decoding of data in accordance with the present invention.
FIG. 8 is a schematic block diagram of a generic example of an error decoding function in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
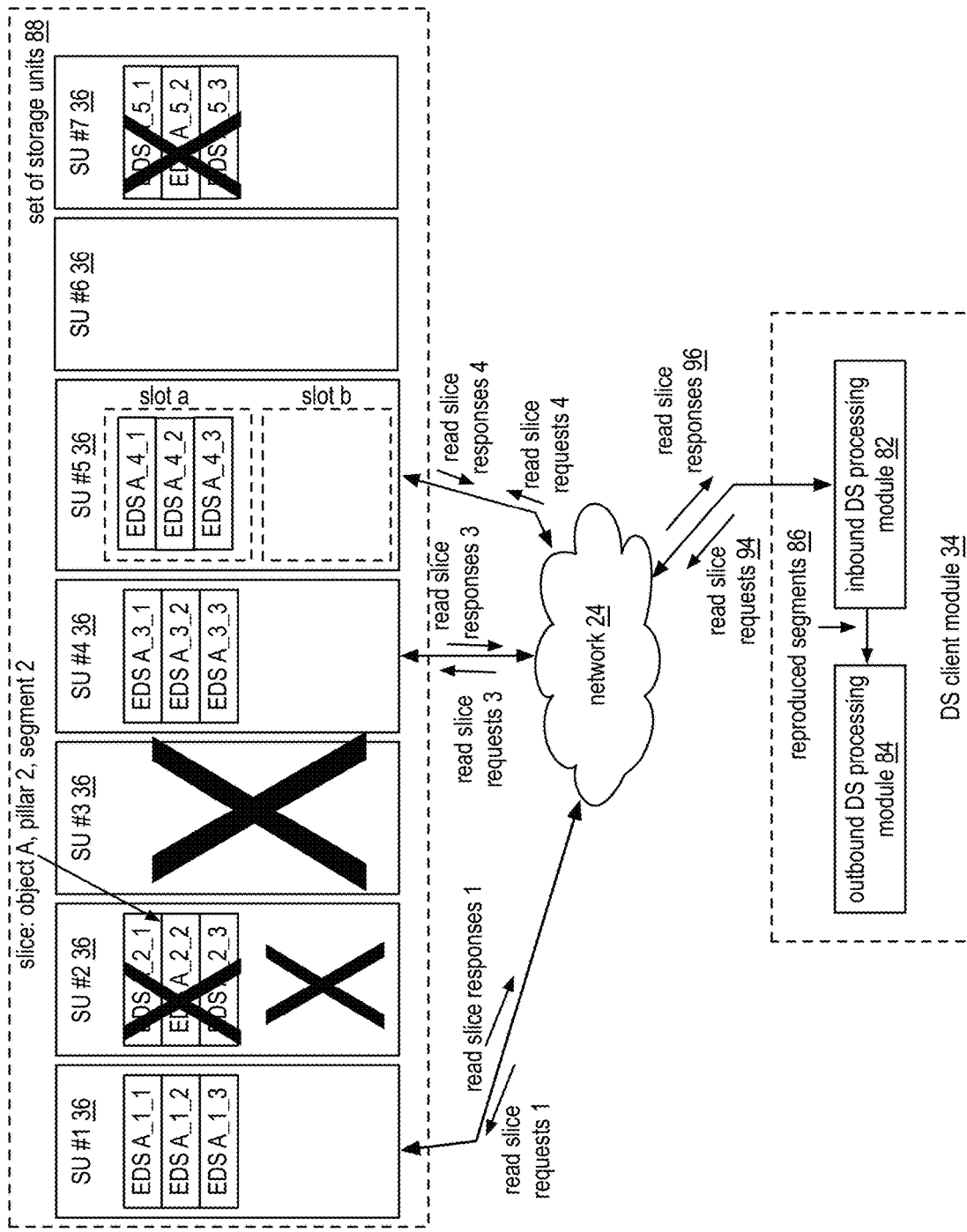
FIG. 9 is a schematic block diagram of another embodiment of a dispersed storage network (DSN) in accordance with the present invention.
Figure 10:
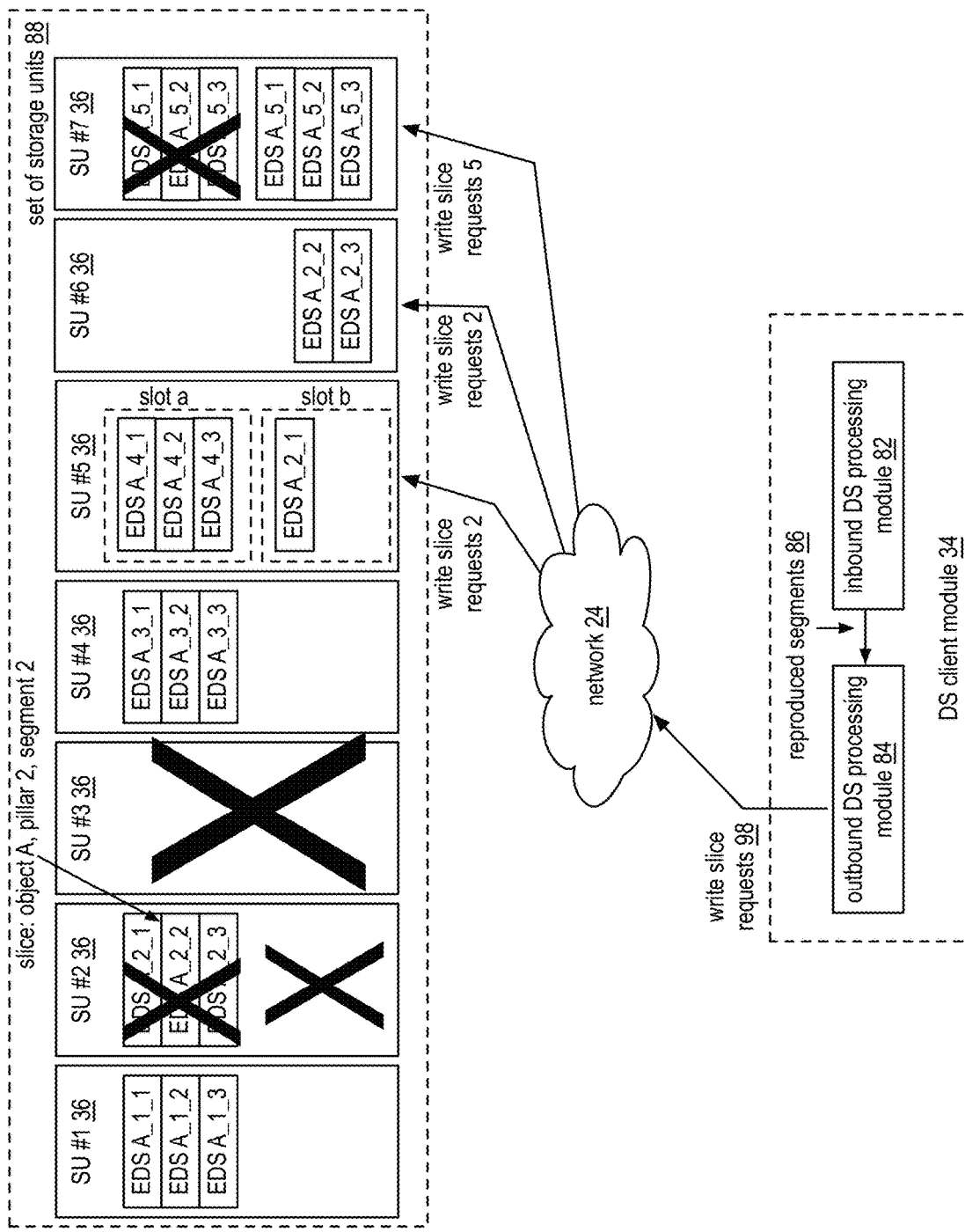
FIG. 10 is a schematic block diagram of another embodiment of a dispersed storage network (DSN) in accordance with the present invention.

FIGS. 9 and 10 are schematic block diagrams of another embodiment of a dispersed storage network (DSN) that includes the distributed or dispersed storage (DS) client module 34 of FIG. 1, the network 24 of FIG. 1, and a set of storage units 36 of FIG. 1. Each storage unit provides at least one storage slot of N storage slots. For example, the storage unit set includes storage units 1-7 when 8 storage slots are provided with storage unit 5 providing two storage slots and the other storage units providing one storage slot each. The DS client module 34 includes an outbound dispersed storage (DS) processing module 84 and an inbound DS processing module 82. The DSN functions to store data as a plurality of data segments, where each data segment is encoded to produce a set of encoded data slices that are sent to the set of storage units 1-7, to retrieve the data from the set of storage units 1-7, and to rebuild errant encoded data slices of the plurality of sets of encoded data slices.

As a specific example of the rebuilding of the errant encoded data slices, the example begins with FIG. 9 where the DS client module 34 detects slice errors to identify the errant encoded data slices. For example, the DS client module 34 issues list slice requests to each storage unit for at least a portion of a source name range assigned to the storage unit set, receives list slice responses indicating slice names of stored encoded data slices and/or the errant encoded data slices, and compares the list slice responses to identify missing and/or corrupted encoded data slices as the errant encoded data slices. For example, the DS client module 34 identifies missing slices associated with storage unit 2 (e.g., data object A, pillar 2, segments 1-3) and corrupted slices associated with storage unit 7 (e.g., data object A, pillar 5, segments 1-3).

Having identified the errant slices, for each data segment, when the DS client module 34 identifies an error threshold number (e.g., such that a number of remaining non-errant encoded data slices is substantially the same or greater than a decode threshold number) of errant encoded data slices, the inbound DS processing module 82 obtains a decode threshold number of encoded data slices of the data segment. For example, the inbound DS processing module 82 issues read slice requests 94 to storage units associated with at least a decode threshold number of storage slots (e.g., to storage units 1, 4, and 5 when storage unit 3 is unavailable, storage units 2 and 7 have errant encoded data slices, and storage units 1, 4-5 are associated with storage slots utilized to store at least a decode threshold number of encoded data slices), receives the at least a decode threshold number of encoded data slices (e.g., from received read slice responses 96), and decodes the at least a decode threshold number of received encoded data slices to reproduce the data segment as part of reproduced data segments 86.

The rebuilding example continues with FIG. 10 where the inbound DS processing module 82 sends the reproduced data segments 86 to the outbound DS processing module 84. For each reproduced data segment, the outbound DS processing module 84 encodes the reproduced data segment to produce rebuilt encoded data slices corresponding to the errant encoded data slices. For example, the outbound DS processing module 84 dispersed storage error encodes the reproduce data segment to produce a set of encoded data slices that includes the rebuilt encoded data slices.

Having produced the rebuilt encoded data slices, the outbound DS processing module 84 identifies, for each rebuilt encoded data slice, a storage slot for storage of the rebuilt encoded data slice in accordance with a rebuilding mapping approach. The rebuilding mapping approach includes one or more of selecting storage slots associated with available storage units and selecting storage slots originally utilized for storage of the corresponding errant encoded data slices when the storage slot original utilized for storage is associated with a storage unit that is now available. For example, the outbound DS processing module 84 identifies utilization of a second storage slot associated with storage unit 5 and a storage slot associated with storage unit 6 for storage of rebuilt encoded data slices associated with pillar 2 when storage units 5 and 6 are available storage and storage unit 2 is still unavailable; and identifies utilization of a storage slot associated with storage unit 7 for storage of rebuilt encoded data slices associated with pillar 5 when storage unit 7 is available.

Having identified storage slots, for each identified storage slot, the outbound DS processing module issues a write slice request 98 to a storage unit associated with the storage slot, where the write slice request 98 includes one or more rebuilt encoded data slices associated with the identified storage slot. For example, the outbound DS processing module 84 issues a write request 2 to storage unit 5 where the write request 2 includes a rebuilt encoded data slice for data object A, pillar 2, and segment 1 etc.

Alternatively, or in addition to, the outbound DS processing module 84 updates an association of slice names and identified storage slots. For example, the outbound DS processing module 84 updates a dispersed storage network directory to associate slice names of the rebuilt encoded data slices, the identified storage slots, and identifiers of the associated storage units. Alternatively, or in addition to, the DS client module 34 facilitates migration of the stored rebuilt encoded data slices from the identified storage slots to original storage slots associated with the errant encoded data slices. For example, the DS client module 34 issues a migration request to storage unit 6 to write rebuilt encoded data slices A-2-2 and A-2-3 to storage unit 2 when storage unit 2 is available.

Figure 11:
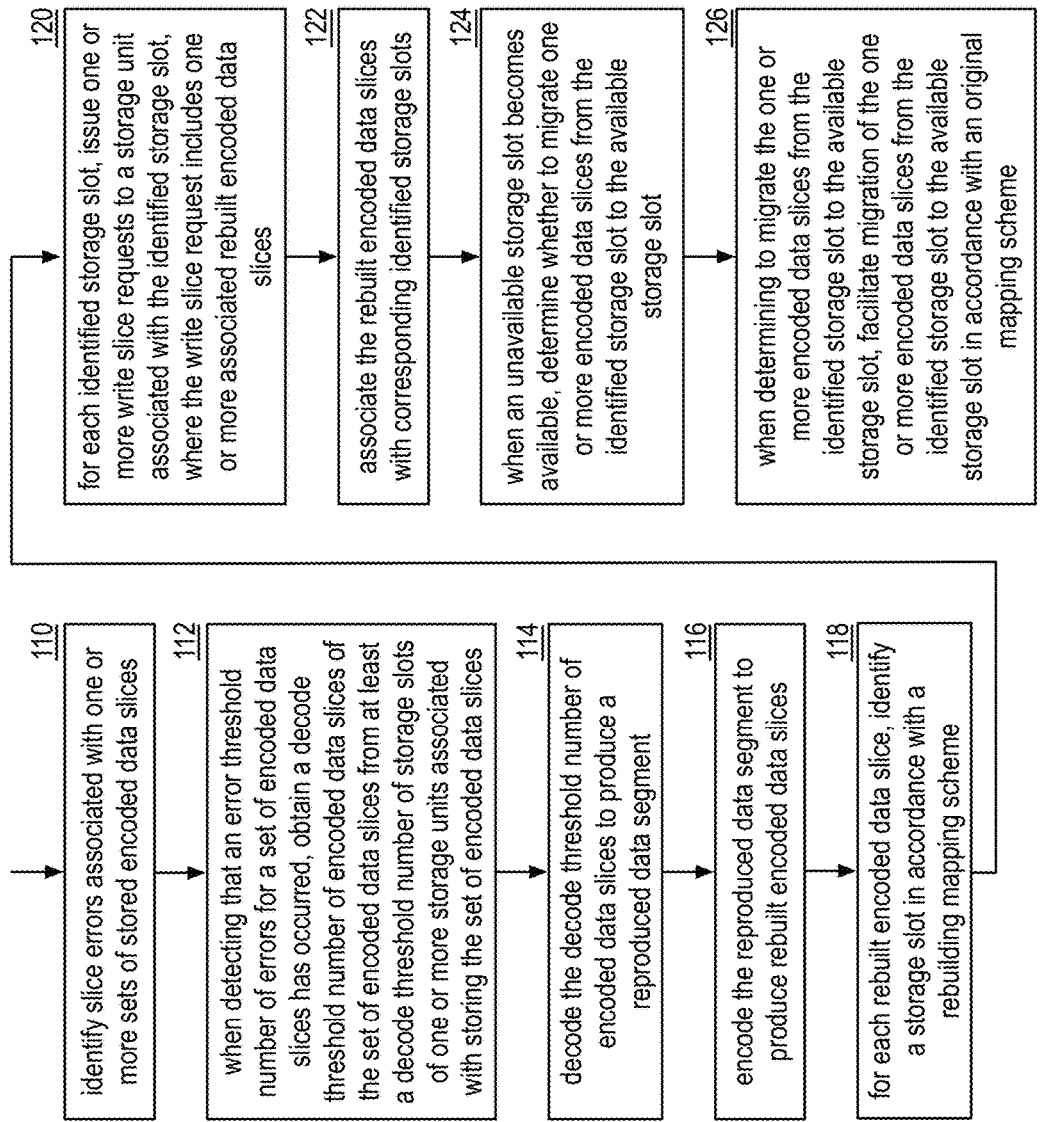
FIG. 11 is a flowchart illustrating an example of rebuilding an encoded data slices in accordance with the present invention.

FIG. 11 is a flowchart illustrating an example of rebuilding an encoded data slices. The method begins at step 110 where a processing module (e.g., of a distributed storage (DS) client module) identifies slice errors associated with one or more sets of stored encoded data slices (e.g., receive an error message, obtain slice lists and compare). The method continues at step 112, where the processing module, when detecting that an error threshold number of errors for a set of encoded data slices has occurred, obtains a decode threshold number of encoded data slices of the set of encoded data slices from at least a decode threshold number of storage slots of one or more storage units associated with storing the set of encoded data slices. For example, the processing module detects that to slice errors have occurred for a set of encoded data slices, identifies available storage slots and associated storage units, issues read slice requests to the identified available storage units, and receives the at least a decode threshold number of encoded data slices.

The method continues at step 114 where the processing module decodes (e.g., dispersed storage error decodes) the at least the decode threshold number of encoded data slices to produce a reproduced data segment. The method continues at step 116 where the processing module encodes (e.g., dispersed storage error encodes) the reproduced data segment to produce a set of rebuilt encoded data slices. At least some of the rebuilt encoded data slices corresponds to errant encoded data slices associated with the identified slice errors. For example, the processing module identifies rebuilt encoded data slices for pillars 2 and 5 as required rebuilt encoded data slices when the identified rebuilt encoded data slices for pillars 2 and 5 correspond to errant encoded data slices of slice errors detected for pillars 2 and 5 of a set of five encoded data slices.

The method continues at step 118, where for each required rebuilt encoded data slice, the processing module identifies a storage slot in accordance with a rebuilding mapping scheme. For example, the processing module identifies available storage slots associated with available associated storage units and assigns each required rebuilt encoded data slice to the identified available storage slots. For each identified storage slot, the method continues at step 120 where the processing module issues one or more write slice requests to a storage unit associated with the identified storage slot. The write slice request includes one or more associated required rebuilt encoded data slices (e.g., required rebuilt encoded data slices associated with a common storage unit).

The method continues at step 122 where the processing module associates the required rebuilt encoded data slices with corresponding identified storage slots. For example, the processing module updates a dispersed storage network directory to associate slice names of the required rebuilt encoded data slices with the corresponding identified storage slots and associated storage units to enable subsequent retrieval when retrieving particular stored encoded data slices.

When an unavailable storage slot becomes available, the method continues at step 124 where the processing module determines whether to migrate one or more encoded data slices from the identified storage slot to the available storage slot. For example, the processing module compares and original mapping scheme to identify slices that are now stored at different storage units in accordance with the rebuilding mapping scheme.

When determining to migrate the one or more encoded data slices from the identified storage slot to the available storage slot, the method continues at step 126 where the processing module facilitates migration of the one or more encoded data slices from the identified storage slot to the available storage slot in accordance with an original mapping scheme. The facilitating includes one or more of retrieving an encoded data slices, re-storing encoded data slices, and issuing a migration request to at least one of two storage units associated with the migration.

Figure 12:
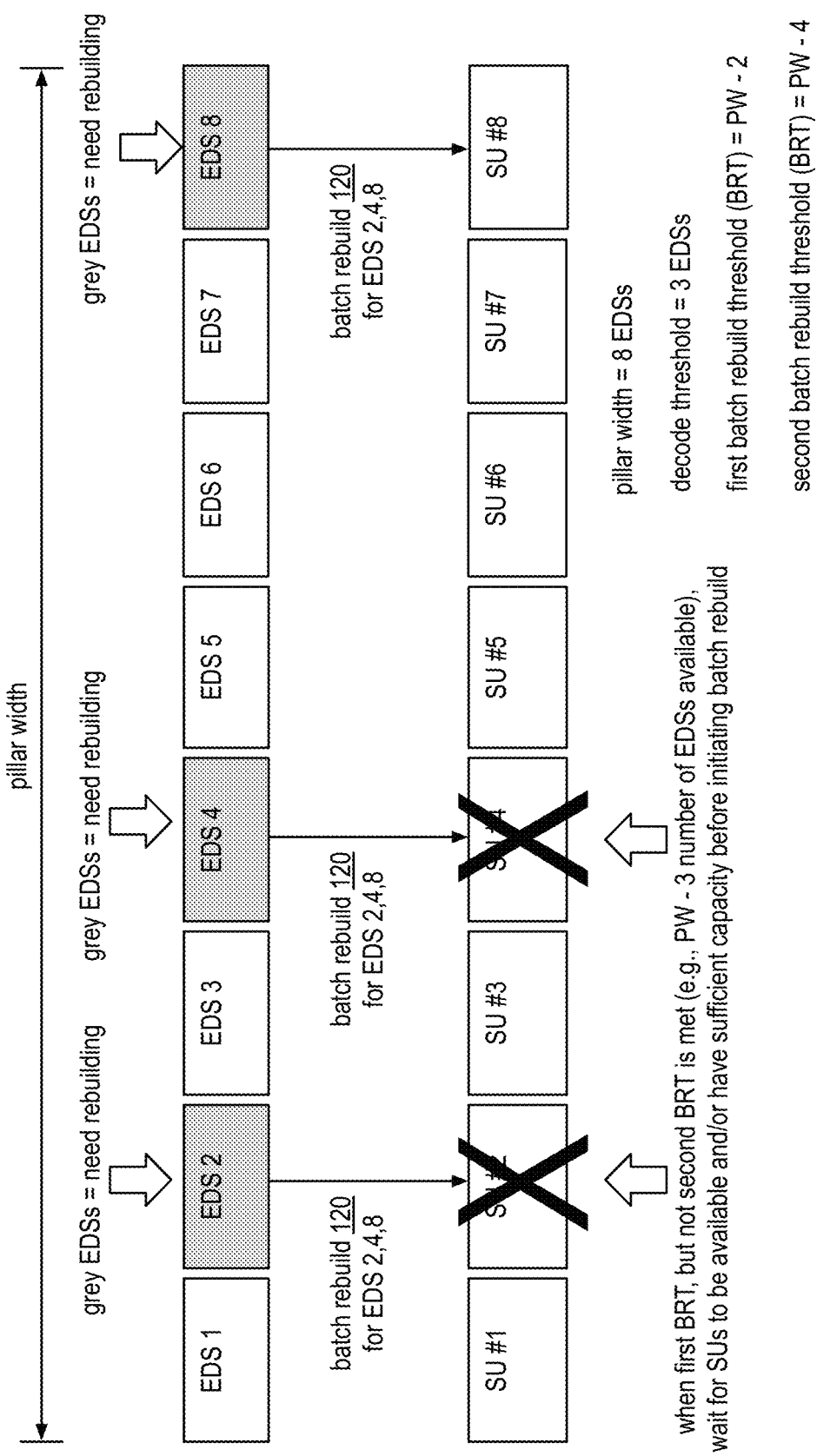
FIG. 12 is a schematic block diagram of an example of a batch rebuilding process in accordance with the present invention.

FIG. 12 is a schematic block diagram of an example of a batch rebuilding process of a set of encoded data slices (e.g., EDS 1 through EDS 8) in a set of storage units (e.g., SU #1 through SU #8) of a dispersed storage network (DSN). A storage unit of the set of storage units may be implemented by a storage unit 36 of FIG. 1. As illustrated, a pillar width number (e.g., 8) of encoded data slices (EDSs) are stored in the set of storage units. Note that a data segment of data is dispersed storage error encoded in accordance with dispersed data storage parameters into the set of encoded data slices. The dispersed data storage parameters include a pillar width number, and a decode threshold number (e.g., minimum number of encoded data slices needed to reconstruct the data segment).

After storage of a set of encoded data slices, one or more encoded data slices may need rebuilding. For example, an encoded data slice of the one or more encoded data slices is stored in a storage unit that is unavailable. As another example, an encoded data slice of the one or more encoded data slices is determined to be corrupt, missing, and/or flagged for rebuilding. In some cases, it may be preferable to defer (e.g., postpone) the rebuilding of the encoded data slice. For example, when more than a decode threshold number of encoded data slices are available, waiting until another encoded data slice of the set of encoded data slices need rebuilding to rebuild the encoded data slice saves processing costs. For instance, performing a rebuild process separately for two individual encoded data slices may cost more than performing a rebuild process once for two or more encoded data slices while still maintaining a threshold level of reliability. As another example, waiting until a storage unit that is responsible for storing a rebuilt encoded data slice is available saves storage and migration costs of storing and migrating the rebuilt encoded data slice.

In an example, when one or more storage units are not available that are missing encoded data slices at the time when a first batch rebuild threshold is met, the computing device waits until the one or more storage units are back online, have sufficient capacity to store a rebuilt data, or until a reliability threshold (e.g., a second batch rebuild threshold) is met. For example, the computing device waits to execute a batch rebuild process until only the decode threshold number of encoded data slices are available. As another example, the computing device waits to execute a batch rebuild process until a number of encoded data slices that are available are within a threshold difference (e.g., 20%, 3 encoded data slices, etc.) from the decode threshold number.

In an example of operation, a set of encoded data slices (e.g., EDS 1-8) are stored in a set of storage unit #1-#8. The pillar width number is 8, the decode threshold number is 3, a first batch rebuild threshold (BRT) is 6 (e.g., PW−2), and a second RBT is 4 (e.g., PW−4). Encoded data slices shown in white (EDS 1, 3, 5, 6, and 7) are available and encoded data slices shown in grey (EDS 2, 4 and 8) need rebuilding. When the first batch rebuild threshold is met (e.g., 6 or less available encoded data slices, a computing device delays the batch rebuild process. For example, the computing device determines encoded data slices 2, 4, and 8 need rebuilding and delays the batch rebuild process. The delaying includes determining whether target storage units for storing encoded data slices that need rebuilding are unavailable or whether a second batch rebuild threshold is met. For example, encoded data slices 2, 4 and 8 are to be stored in storage units 2, 4, and 8, of which storage units 2 and 4 are unavailable and the second batch threshold (e.g., 4 or less available encoded data slices) is not met. Thus, the computing device determines to delay the batch rebuild process until a second batch rebuild threshold is met or until one or both of the storage units 2 and 4 come back online.

When a threshold number of the target storage units are available, the computing device executes the batch rebuild process to produce rebuilt encoded data slices. The computing device then stores the rebuilt encoded data slices in the target storage units. If the second batch rebuild threshold is met (e.g., encoded data slices 2, 4, 6, and 8 need rebuilding) before the threshold number of the target storage units are available, the computing device executes the batch rebuild process to produce rebuilt encoded data slices. The computing device then stores the rebuilt encoded data slices in the available storage units and one or more foster storage units.

For example, the computing device rebuilds encoded data slices 2, 4, 6 and 8 and determines to store encoded data slices 6 and 8 in storage units 6 and 8 and determines one or more foster storage units (e.g., a different storage unit than originally mapped to store the respective encoded data slice that needs rebuilding) for storing encoded data slices 2 and 4. The computing device then sends a batch rebuild request 120 to the respective storage units that are to store the encoded data slices 2, 4, 6 and 8.

FIGS. 13A-D are a schematic block diagrams of another example of a batch rebuilding process in a dispersed storage network (DSN) that includes a set of storage units 88. The set of storage units 88 include storage units 36 #1-#7. A storage unit of the storage units 36 may be implemented by a storage unit 36 of FIG. 1. The set of storage units include 8 storage slots (e.g., one in storage units 1, 2, 3, 4, 6 and 7 and two in storage unit 5). In this example, the pillar width number is 7, the decode threshold number is 3, the first batch rebuild threshold (BRT) number is 5 and the second batch rebuild threshold number is 4.

At time t1 of FIG. 13A, the set of storage units 88 are storing three sets of encoded data slices. The first set of encoded data slices includes encoded data slices EDS A_1_1 through EDS A_7_1. The second set of encoded data slices includes encoded data slices EDS A_1_2 through EDS A_7_2. The third set of encoded data slices includes encoded data slices EDS A_1_3 through EDS A_7_3.

At time t2, storage unit 7 becomes unavailable (e.g., is offline, is undergoing maintenance, is being replaced, is damaged, etc.). Thus, the available number of encoded data slices for each of the three sets of encoded data slices is 6. Thus, the first batch rebuild threshold (e.g., 5 available encoded data slices) and the second batch rebuild threshold (e.g., 4 available encoded data slices) are both not met for any of the three sets of encoded data slices stored in the set of storage units 88.

At time t3, encoded data slice A_5_1 is detected to have an error and needs rebuilding. For example, storage unit 5 responded to a list slice request with a list slice response that did not include encoded data slice A_5_1. As another example, storage unit 5 did not respond with encoded data slice A_5_1 in response to a read request for encoded data slice A_5_1. As such, the available number of encoded data slices for the second and third set of encoded data slices is 6 and the available number of encoded data slices for the first set of encoded data slices is 5. As such, a computing device determines the first batch rebuild threshold is met for the first set of encoded data slices (e.g., the number of available encoded data slices for the first set=the first batch rebuild threshold number). The first and second batch rebuild thresholds are not met for the second and third sets of encoded data slices as they still have 6 encoded data slices available in each set.

Having determined the first batch rebuild threshold has been met for the first set of encoded data slices, the computing device determines whether a target storage unit of target units to store rebuilt encoded data slices is unavailable. When a target storage unit is unavailable, the computing device determines to delay a batch rebuild process until storage unit 7 becomes available or the second batch rebuild threshold is met. Since the second batch threshold is not met for the first set of encoded data slices, the computing device waits to execute the batch rebuild process until one or more of a time period as elapsed, the second rebuild threshold is met, receiving a command to execute the batch rebuild process, and the target storage units are available. Note that if storage unit 7 was online at this point (e.g., the first batch rebuild threshold being met) then the computing device would execute a batch rebuild process to store rebuilt encoded data slices in the target storage units.

FIG. 13B continues with the example of FIG. 13A at time t4, where the computing device is waiting for the storage unit 7 to become available or for the second batch threshold to be met (e.g., another encoded data slice of the first set of encoded data slices becomes unavailable). The first and second batch rebuild thresholds are not met for the second and third sets of encoded data slices as they still have 6 encoded data slices available in each set. The first set remains in the delaying phase, as the first batch rebuild threshold is still met, the second batch rebuild threshold is not met, and the storage unit 7 is still unavailable.

Continuing to time t5, storage unit 3 becomes unavailable. As such, the available number of encoded data slices for the second and third set of encoded data slices is now 5 and the available number of encoded data slices for the first set of encoded data slices is 4. Thus, the first batch rebuild threshold is met for the second and third sets of encoded data slices. The computing device then determines whether a target storage unit is unavailable. In this instance, target storage units 3 and 7 are unavailable. Thus the computing device determines to delay execution of the batch rebuild process until one or more of a time period as elapsed, the second rebuild threshold is met, receiving a command to execute the batch rebuild process, and the target storage units 3 and 7 are available. In one example, the computing device determines to forego the delaying once a storage unit (e.g., one of storage unit 3 or 7) is available.

Also at time t5, the available number of encoded data slices for the first set of encoded data slices is 4 which indicates the second batch rebuild threshold is met. Thus, the computing device executes a batch rebuild process for the first set of encoded data slices. The batch rebuild process includes retrieving a decode threshold number of encoded data slices of the first set of encoded data slices (e.g., any 3 of EDS A_1_1, EDS A_2_1, EDS A_4_1 and EDS A_6_1), reconstructing a data segment from the decode threshold number of encoded data slices, and dispersed storage error encoding the reconstructed data segment to produce a new first set of encoded data slices. The computing device then sends batch rebuild requests to the set of storage units to store the new first set of encoded data slices therein.

In this specific example, the computing device generates encoded data slices EDS A_3_1, EDS A_5_1, and EDS A_7_1 from the reconstructed data segment. Because storage units 3 and 7 are unavailable, the computing device determines foster storage units for encoded data slices EDS A_3_1, and EDS A_7_1. For example, the computing device determines to store encoded data slice A_3_1 in slot b of storage unit #5 and encoded data slice A_7_1 in storage unit #6. The computing device then sends EDS A_3_1 and EDS A_5_1 to storage unit 5, and EDS A_7_1 to storage unit 7 for storage therein.

FIG. 13C continues with the example of FIGS. 13A-13B at time t6, where encoded data slices EDS A_3_1, EDS A_5_1, and EDS A_7_1 are stored in storage units 5 and 6. Further, storage unit 7 has been replaced. The computing device then determines to migrate encoded data slices EDS A_7_1 to storage unit 7 in accordance with an updated mapping of EDS A_7_1 to storage unit 7. At this time, the first set of encoded data slices has 7 available encoded data slices in the set of storage units. The second and third sets of encoded data slices have 5 available encoded data slices in the set of storage units. Thus, the first, but not the second batch rebuild threshold is still met for the second and third sets of encoded data slices. Thus, the computing device waits for a threshold number of the unavailable storage units (e.g., all target storage units, #of available target storage units≥#of unavailable storage units, a predetermination, etc.) to become available or until a second batch rebuild threshold is met. In this example, the threshold number of unavailable storage units is all storage units to execute the batch rebuild process.

Note that when the threshold number of available storage units is met, the computing device will determine to execute the batch rebuild process. Note in another the example, the threshold number may be different. As one example, when three encoded data slices need rebuilding in three target storage units of the set of storage units, the threshold number is 2 of the 3 storage units. In another example, when four encoded data slices need rebuilding and three of the four encoded data slices are for storage in three target storage units of the set of storage units, the threshold number is 1 of the 3 storage units. At time t7, storage unit 3 is replaced and comes back online. The computing device determines to migrate EDS A_3_1 from slot b of storage unit #5 to storage unit #3.

FIG. 13D continues with the example of FIGS. 13A-C at time t8, where the computing device determines that the threshold number of target storage units are available. Alternatively, the computing device determines there are no unavailable target storage units. As such, the computing device executes the batch rebuild process for the second and third sets of encoded data slices. For example, the computing device retrieves a decode threshold number of encoded data slices for each of the second and third sets of encoded data slices, reconstructs a second and third data segment, dispersed storage error encodes the second and third reconstructed data segments into new second rebuilt encoded data slices (e.g., EDS A_3_2, EDS A_7_2) and new third rebuilt encoded data slices (e.g., EDS A_3_3, EDS A_7_3). The computing device then sends the new second and third rebuilt encoded data slices to storage units 3 and 7 for storage therein.

At time t9, the rebuilt encoded data slices EDS A_3_2 and EDS A_3_3 are stored in storage unit 3 and the rebuilt encoded data slices EDS A_7_2 and EDS A_7_3 are stored in storage unit 7. Thus the first, second and third sets of encoded data slices have the pillar width number of encoded data slices available in the set of storage units.

FIG. 14 is a flowchart illustrating an example of a method of a batch rebuilding process that begins or continues with step 140, where a computing device of a dispersed storage network (DSN) identifies one or more encoded data slices of the set of encoded data slices that need rebuilding. The method continues to step 142, where the computing device determines whether a first batch rebuild threshold is met. For example, the first batch threshold is met when a first rebuild threshold number of encoded data slices of the set of encoded data slices need rebuilding. For instance, the computing device identifies an encoded data slice of the set of encoded data slices that need rebuilding. The computing device then determines whether other encoded data slices of the set of encoded data slices need rebuilding. When a number of the encoded data slice and the other encoded data slices that need rebuilding is equal to the first rebuild threshold number, the computing device determines the first batch rebuild threshold is met.

When the first batch threshold is not met, the method continues to step 152, where the computing device queues the batch rebuild process for the encoded data slice. For example, the computing device adds the encoded data slice to a rebuild list.

When the first batch threshold is met, the method continues to step 144, where the computing device determines whether a target storage unit of target storage units of the DSN are available. When a target storage unit of the target storage units is unavailable, the method continues to step 146, where the computing device delays a batch rebuild process until the target storage unit is available or a second batch rebuild threshold is met.

The method continues to step 148, where the computing device determines whether the second batch rebuild threshold is met. When the second batch threshold is not met, the method continues back to step 144. When the second batch threshold is met, the method continues to step 150, where the computing device executes a batch rebuild process to produce rebuilt encoded data slices. The computing device then sends the rebuilt encoded data slices to the set of storage units for storage therein. For example, when a target storage unit is unavailable, the computing device determines a foster storage unit (e.g., a storage unit that has an available storage slot, adding another storage unit to the set of storage units, etc.) for storing one or more of the rebuilt encoded data slices that were mapped to the unavailable target storage unit. For the target storage units that are available, the computing device sends corresponding rebuilt encoded data slices to the available target storage units for storage therein.

Note a computing device that includes memory, an interface, and a processing module is operable to perform any of the above methods and/or steps. Further note, a computer readable storage device that include one or more memory elements that store operational instructions, that when executed by a computing device, causes the computing device to perform any of the above methods and/or steps.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprises:
   when a first batch rebuild threshold is met:
   determining, by a computing device of a dispersed storage network (DSN), whether target storage units of a set of storage units of the DSN are available, wherein:
   a data segment of data is dispersed storage error encoded into a set of encoded data slices;
   the set of encoded data slices is stored in the set of storage units;
   a number of encoded data slices of the set of encoded data slices that need rebuilding corresponds to the first batch rebuild threshold; and
   the number of encoded data slices is to be stored in the target storage units;
   when a target storage unit of the target storage units is unavailable:
   delaying, by the computing device, a batch rebuild process until the target storage unit is available or a second batch rebuild threshold is met; and
   when the target storage unit becomes available before the second batch rebuild threshold is met, executing by the computing device, the batch rebuild process for the number of encoded data slices.

2. The method of claim 1 further comprises:
   when the target storage unit does not become available before the second batch rebuild threshold is met, executing by the computing device, the batch rebuild process for a second number of encoded data slices that need rebuilding, wherein the second number of encoded data slices corresponds to the second batch rebuild threshold; and
   selecting a foster storage unit for the target storage unit, wherein the foster storage unit stores an encoded data slice of the second number of encoded data slices that was mapped to be stored in the unavailable target storage unit.

3. The method of claim 1, wherein the first batch rebuild threshold is met when a first rebuild threshold number of encoded data slices of the set of encoded data slices need rebuilding.

4. The method of claim 3 further comprises:
   identifying encoded data slices of the set of encoded data slices that need rebuilding; and
   when a second number of the identified encoded data slices that need rebuilding is equal to the first rebuild threshold number, determining the first batch rebuild threshold is met.

5. The method of claim 4, wherein when the second number of the identified encoded data slices is less than the first rebuild threshold number, queueing the batch rebuild process for the second number of the identified encoded data slices.

6. The method of claim 1 further comprises:
   when the target storage units are available:
   executing the batch rebuild process for the number of encoded data slices.

7. The method of claim 6, wherein the executing of the batch rebuild process comprises:
   retrieving, from the set of storage units, a decode threshold number of encoded data slices of the set of encoded data slices, wherein the decode threshold number of encoded data slices is a minimum number of encoded data slices that are needed to reconstruct the data segment;
   dispersed storage error decoding the decode threshold number of encoded data slices to reconstruct the data segment;
   dispersed storage error encoding the reconstructed data segment to produce the number of new encoded data slices; and
   storing the number of the new encoded data slices in the target storage units.

8. A computing device of a dispersed storage network (DSN) comprises:
   memory;
   an interface; and
   a processing module operably coupled to the memory and the interface, wherein the processing module is operable to:
   when a first batch rebuild threshold is met:
   determine whether target storage units of a set of storage units of the DSN are available, wherein:
   a data segment of data is dispersed storage error encoded into a set of encoded data slices;
   the set of encoded data slices is stored in the set of storage units;
   a number of encoded data slices of the set of encoded data slices that need rebuilding corresponds to the first batch rebuild threshold; and
   the number of encoded data slices is to be stored in the target storage units;
   when a target storage unit of the target storage units is unavailable:
   delay a batch rebuild process until the target storage unit is available or a second batch rebuild threshold is met; and
   when the target storage unit becomes available before the second batch rebuild threshold is met, execute the batch rebuild process for the number of encoded data slices.

9. The computing device of claim 8, wherein the processing module is further operable to:
   when the target storage unit does not become available before the second batch rebuild threshold is met, execute the batch rebuild process for a second number of encoded data slices that need rebuilding, wherein the second number of encoded data slices corresponds to the second batch rebuild threshold; and
   select a foster storage unit for the target storage unit, wherein the foster storage unit stores an encoded data slice of the second number of encoded data slices that was mapped to be stored in the unavailable target storage unit.

10. The computing device of claim 8, wherein the processing module is further operable to:
    determine the first batch rebuild threshold is met when a first rebuild threshold number of encoded data slices of the set of encoded data slices need rebuilding.

11. The computing device of claim 10, wherein the processing module is further operable to:
    identify encoded data slices of the set of encoded data slices that need rebuilding; and
    when a second number of the identified encoded data slices that need rebuilding is equal to the first rebuild threshold number, determine the first batch rebuild threshold is met.

12. The computing device of claim 11, wherein when the second number of the identified encoded data slices is less than the first rebuild threshold number, the processing module is further operable to:
queue the batch rebuild process for the second number of the identified encoded data slices.

13. The computing device of claim 8, wherein the processing module is further operable to:
when the target storage units are available:
execute the batch rebuild process for the number of encoded data slices.

14. The computing device of claim 13, wherein the processing module is operable to execute of the batch rebuild process by:
retrieving, via the interface from the set of storage units, a decode threshold number of encoded data slices of the set of encoded data slices, wherein the decode threshold number of encoded data slices is a minimum number of encoded data slices that are needed to reconstruct the data segment;
dispersed storage error decoding the decode threshold number of encoded data slices to reconstruct the data segment;
dispersed storage error encoding the reconstructed data segment to produce the number of new encoded data slices; and
sending, via the interface, the number of the new encoded data slices to the target storage units for storage therein.

* * * * *